United States Patent [19]

Nagai

[11] Patent Number: 5,701,322
[45] Date of Patent: Dec. 23, 1997

[54] SEMICONDUCTOR LASER FOR PUMPING LIGHT AMPLIFIER

[75] Inventor: Yutaka Nagai, Tokyo, Japan

[73] Assignee: Mitsubishi Denki Kabushiki Kaisha, Tokyo, Japan

[21] Appl. No.: 575,121

[22] Filed: Dec. 19, 1995

[30] Foreign Application Priority Data

Jul. 14, 1995 [JP] Japan ................................. 7-178759

[51] Int. Cl.$^6$ ....................................... H01S 3/19
[52] U.S. Cl. ................................. 372/46; 372/45
[58] Field of Search ............................. 372/45, 46

[56] References Cited

U.S. PATENT DOCUMENTS

| | | | |
|---|---|---|---|
| 5,363,398 | 11/1994 | Glass et al. | 372/45 |
| 5,389,797 | 2/1995 | Bryan et al. | 257/436 |
| 5,581,570 | 12/1996 | Yoshida et al. | 372/46 |

FOREIGN PATENT DOCUMENTS 63-213988   9/1988   Japan .
63-233587   9/1988   Japan .

OTHER PUBLICATIONS

Shima et al., "0.78–and 0.98–µm Ridge–Waveguide Lasers Buried with AlGaAs Confinement Layer Selectively Grown by Chloride–Assisted MOCVD", IEEE Journal of Selected Topics in Quantum Electronics, vol. 1, No. 2, Jun. 1995, pp. 102–109.

*Primary Examiner*—James W. Davie
*Attorney, Agent, or Firm*—Leydig, Voit & Mayer, LTD.

[57] ABSTRACT

A semiconductor laser includes a first conductivity type semiconductor substrate; a first conductivity type cladding layer disposed on the semiconductor substrate; an active layer disposed on the first conductivity type cladding layer for producing light having a wavelength $\lambda$; a light waveguide structure including a second conductivity type cladding layer disposed on the active layer; a first conductivity type current blocking layer disposed on, contacting, and confining the light waveguide structure and containing an element absorbing light having the wavelength $\lambda$; and a second conductivity type contacting layer contacting the light waveguide structure and the current blocking layer.

14 Claims, 6 Drawing Sheets

SEMICONDUCTOR LASER FOR PUMPING LIGHT AMPLIFIER

FIELD OF THE INVENTION

This invention relates to a semiconductor laser and, more particularly, to a semiconductor laser for pumping a light amplifier, such as an optical fiber doped with erbium, and a method of making the semiconductor laser.

BACKGROUND OF THE INVENTION

In optical communication, information is transmitted by modulating light. It is well known that the modulated light can be amplified in an optical fiber containing an appropriate dopant, such as erbium, provided the optical fiber is pumped with light of an appropriate energy, i.e., wavelength. The pumping light must have a higher energy, i.e., a shorter wavelength, than the wavelength that is amplified in the doped optical fiber. For example, in light amplifiers employing optical fibers doped with erbium, the pumping light may have a wavelength of 0.98 micron and semiconductor lasers producing light at that wavelength have recently been developed. Those semiconductor lasers typically employ an active layer including a quantum well structure with InGaAs well layers and AlGaAs barrier layers alternatingly laminated within the active layer. Examples of such semiconductor laser structures are described in "0.78- and 0.98- μm Ridge-Waveguide Lasers Buried with AlGaAs Confinement Layer Selectively Grown by Chloride-Assisted MOCVD", IEEE Journal of Selected Topics in Quantum Electronics, Volume 1, Number 2, pages 102-109, June 1995, the disclosure of which is incorporated herein, and in Japanese Unexamined Patent Publications Sho. 63-213988 and Sho. 63-233587.

FIG. 5 is a perspective view illustrating an example of a conventional semiconductor laser structure suitable for pumping a light amplifier. The semiconductor laser of FIG. 5 includes an n-type GaAs substrate 1 on which are successively disposed an n-type $Al_{0.5}Ga_{0.5}As$ cladding layer 2, an active layer 3 including a quantum well structure of InGaAs and AlGaAs, a first p-type $Al_{0.5}Ga_{0.5}As$ cladding layer 4, and a p-type $Al_{0.7}Ga_{0.3}As$ etching stopping layer 5. On part of the etching stopping layer 5 are successively disposed a second p-type $Al_{0.5}Ga_{0.5}As$ cladding layer 6, a p-type GaAs first contacting layer 7, and a p-type GaAs second contacting layer 9. The second p-type cladding layer 6 and the first contacting layer 7 have a ridge shape and form a resonator cavity of the semiconductor laser. An n-type current blocking layer 14 is present between and contacts the etching stopping layer 5 and the second p-type contacting layer 9 and also contacts side surfaces of the second p-type cladding layer 6 and the first contacting layer 7. First and second electrodes 10 and 11 are disposed on the substrate 1 and the second contacting layer 9, respectively.

A method of making the semiconductor laser of FIG. 5 is illustrated in FIGS. 6(a)-6(e). Initially, as shown in FIG. 6(a), on the semiconductor substrate 1, the n-type cladding layer 2, the quantum well active layer 3, the first p-type cladding layer 4, the etching stopping layer 5, the second p-type cladding layer 6, and the first contacting layer 7 are successively epitaxially grown, preferably by metal organic chemical vapor deposition (MOCVD). Thereafter, a film of an insulating material is deposited on the first contacting layer 7 and patterned to form a longitudinal stripe as an etching mask 13. Examples of materials suitable for the insulating film are $Si_3N_4$ and $SiO_2$. After the etching mask 13 is formed as shown in FIG. 6(b), parts of the first contacting layer 7 and the second p-type cladding layer 6 are removed by chemical etching to form a ridge waveguide 12, as illustrated in FIG. 6(c). The ridge waveguide 12 has a width Wb where it contacts the etching stopping layer 5. In etching and removing parts of the first contacting layer 7 and the second p-type cladding layer 6, the etching in the direction of the substrate is limited by the etching stopping layer 5 which is much more slowly attacked by the etchant employed than are the first contacting layer 7 and the second p-type cladding layer 6.

After formation of the ridge waveguide 12, the n-type current blocking layer 14 is epitaxially grown on the etching stopping layer 5. In the preferred growth process, the current blocking layer 14 does not grow on the etching mask 13. That etching mask 13 is then removed and the second contacting layer 9 is grown on the first contacting layer 7 and the current blocking layer 14. The semiconductor laser is completed by forming the electrodes 10 and 11 on the substrate 1 and the second contacting layer 9, respectively.

When the semiconductor laser of FIG. 5 is forward biased, current flows between the electrodes 10 and 11 and is confined by the current blocking layer 14 and concentrated in the ridge waveguide 12. Holes are injected into the active layer 3 through the first p-type cladding layer 4 and electrons are injected into the active layer 3 through the n-type cladding layer 2. The holes and electrons combine in the active layer 3 and produce light. When the current flow exceeds a threshold, laser oscillation occurs. The semiconductor laser described is frequently referred to as a real index guide type semiconductor laser since current and light are confined in the ridge waveguide 12. The current flow is confined by pn junctions with the current blocking layer 14. The light confinement is produced by making the refractive index of the current blocking layer 14 lower than the refractive index of the second p-type cladding layer 6.

The most desirable form of oscillation in a semiconductor laser is first order transverse mode oscillation. In the first order transverse mode of oscillation, the laser beam produced has a maximum intensity in the center of the beam. In higher order modes of oscillation, the laser beam may have several intensity peaks, with or without a central peak intensity. Numerous laser structures have been devised in order to produce first order transverse mode oscillation and to prevent higher order modes of oscillation that produce adverse effects, such as reduced coupling efficiency between a semiconductor laser and an optical fiber. The semiconductor laser of FIG. 5 includes such a structure as is partially illustrated in FIG. 7(a). There, the current blocking layer 14 and the ridge waveguide 12 are illustrated. In FIG. 7(b), the relative refractive index of the parts of the semiconductor laser shown in FIG. 7(a) is plotted as a function of position. As shown in FIG. 7(b), the refractive index at the ridge waveguide 12 is much higher than the refractive index in the current blocking layer 14 with the result that the laser light is essentially confined to and guided along the ridge waveguide 12 to produce first order transverse mode oscillation.

Although the ridge waveguide 12 confines the laser light, in order to achieve single mode oscillation, it is also necessary to limit waveguide width Wb to a range of about 1 micron to about 1.5 microns to control the oscillation mode effectively. If Wb is larger than about 1.5 microns, second order mode oscillation tends to occur so that the current-light output characteristic of the semiconductor laser is non-linear and includes a kink. Higher order mode oscillation produces a laser beam that has reduced coupling efficiency to an optical fiber. Considering manufacturing tolerances, it is desirable that the design width Wb be 1 micron. However, if Wb is too small, confining the current flowing between the electrodes 10 and 11 to a very narrow region, the current density in that region becomes undesirably high. An excessively high current density can produce an increasing dislocation density within the quantum well structure of the active layer 3, producing continuously deteriorating characteristics during operation of the semiconductor laser. In addition, the density of the light produced can significantly increase, producing increasing temperatures at the laser facets that can result in localized melting and destruction of the semiconductor laser, commonly referred to as catastrophic optical damage (COD).

The width Wb also affects the divergence angle of the laser beam produced by the semiconductor laser. Typically, the divergence angle is measured as the angle between the two points of the laser beam where the intensity of the light is one-half the maximum intensity of the laser beam. Even small changes in the waveguide width Wb produce significant changes in the divergence angle, affecting the dispersion of the laser beam produced by horizontal transverse mode oscillation and reducing the yield of semiconductor lasers with acceptable characteristics.

The known semiconductor lasers producing light with a wavelength of 0.98 micron include noise in the light output because of transverse internal reflections within the lasers that affect the oscillation mode. For example, some of the light produced in the active layer 3 propagates toward the second electrode 11 through the first p-type cladding layer 4, the etching stopping layer 5, the second p-type cladding layer 6, and the first and second contacting layers 7 and 9. Some of that light is reflected from the electrode 11 and returns to the active layer 3. The effect of this reflected light is a sub-peak in the laser beam located about one to three nanometers from a central peak of maximum intensity. That sub-peak is noise that adversely affects the usefulness of the laser.

SUMMARY OF THE INVENTION

The present invention has been made in order to overcome the problems of conventional lasers described above. An object of the present invention is to provide a semiconductor laser suitable for pumping a light amplifier employing a doped optical fiber.

Another object of the invention is to provide a semiconductor laser producing light at a wavelength of 0.98 micron.

A further object of the invention is to provide a semiconductor laser having a stable first order horizontal transverse mode of oscillation without oscillating in higher order modes.

Still another object of the invention is to provide a semiconductor laser having a stable current-light output characteristic and satisfactory coupling efficiency with an optical fiber.

Yet another object of the invention is to provide a semiconductor laser having a high reliability without internal degradation due to increasing dislocation density or COD.

Another object of the invention is to provide a semiconductor laser producing a laser beam containing low noise so that the longitudinal first order mode of oscillation is maintained.

According to a first aspect of the invention, a semiconductor laser includes a first conductivity type semiconductor substrate; a first conductivity type cladding layer disposed on the semiconductor substrate; an active layer disposed on the first conductivity type cladding layer for producing light having a wavelength $\lambda$; a light waveguide structure comprising a second conductivity type cladding layer disposed on the active layer; a first conductivity type current blocking layer disposed on, contacting, and confining the light waveguide structure and containing an element absorbing light having the wavelength $\lambda$; a second conductivity type contacting layer contacting the light waveguide structure and the current blocking layer; and first and second electrodes respectively disposed on the substrate and the contacting layer.

According to a second aspect of the invention, a semiconductor laser includes a first conductivity type semiconductor substrate; a first conductivity type cladding layer disposed on the semiconductor substrate; an active layer disposed on the first conductivity type cladding layer for producing light having a wavelength $\lambda$; a light waveguide structure comprising a second conductivity type cladding layer disposed on the active layer; a first conductivity type current blocking layer disposed on, contacting, and confining the light waveguide structure; a second conductivity type contacting layer contacting the light waveguide structure and the current blocking layer and containing an element absorbing light having the wavelength $\lambda$; and first and second electrodes respectively disposed on the substrate and the contacting layer.

According to a third aspect of the invention, a semiconductor laser includes a first conductivity type semiconductor substrate; a first conductivity type cladding layer disposed on the semiconductor substrate; an active layer disposed on the first conductivity type cladding layer for producing light having a wavelength $\lambda$; a light waveguide structure comprising a first second conductivity type cladding layer disposed on the active layer, a first conductivity type current blocking layer disposed on and contacting the first second conductivity type cladding layer, containing an element absorbing light having the wavelength $\lambda$, and including a groove exposing part of the first second conductivity type cladding layer, and a second second conductivity type cladding layer disposed on the current blocking layer and on the first second conductivity type cladding layer in the groove; a second conductivity type contacting layer disposed on the second second conductivity type cladding layer; and first and second electrodes respectively disposed on the substrate and the contacting layer.

According to a fourth aspect of the invention, a semiconductor laser includes a first conductivity type semiconductor substrate; a first conductivity type cladding layer disposed on the semiconductor substrate; an active layer disposed on the first conductivity type cladding layer for producing light having a wavelength $\lambda$; a light waveguide structure comprising a first second conductivity type cladding layer disposed on the active layer, a first conductivity type current blocking layer disposed on and contacting the first second conductivity type cladding layer and including a groove exposing part of the first second conductivity type cladding layer, and a second second conductivity type cladding layer disposed on the current blocking layer and on the first second conductivity type cladding layer in the groove; a second conductivity type contacting layer disposed on the second second conductivity type cladding layer and containing an element absorbing light having the wavelength $\lambda$; and first and second electrodes respectively disposed on the substrate and the contacting layer.

According to a fifth aspect of the invention, a method of making a semiconductor laser includes successively growing on a first conductivity type semiconductor substrate a first conductivity type cladding layer, an active layer for producing light having a wavelength λ, and a second conductivity type cladding layer; etching and removing part of the second conductivity type cladding layer to form a light waveguide structure; growing a first conductivity type current blocking layer on and contacting the second conductivity type cladding layer, contacting and confining the light waveguide structure, and containing an element absorbing light having the wavelength λ; growing a second conductivity type contacting layer on the current blocking layer and the light waveguide structure; and forming first and second electrodes on the semiconductor substrate and the contacting layer, respectively.

According to a sixth aspect of the invention, a method of making a semiconductor laser includes successively growing on a first conductivity type semiconductor substrate a first conductivity type cladding layer, an active layer for producing light having a wavelength λ, and a second conductivity type cladding layer; etching and removing part of the second conductivity type cladding layer to form a light waveguide structure; growing a first conductivity type current blocking layer on and contacting the second conductivity type cladding layer, contacting and confining the light waveguide structure; growing a second conductivity type contacting layer on the current blocking layer and the light waveguide structure and containing an element absorbing light having the wavelength λ; and forming first and second electrodes on the semiconductor substrate and the contacting layer, respectively.

According to a seventh aspect of the invention, a method of making a semiconductor laser includes successively growing on a first conductivity type semiconductor substrate a first conductivity type cladding layer, an active layer for producing light having a wavelength λ, a first second conductivity type cladding layer, and a first conductivity type current blocking layer containing an element absorbing light having the wavelength λ; etching and removing a portion of the first conductivity type current blocking layer to form a groove exposing part of the first second conductivity type cladding layer; growing a second second conductivity type cladding layer on the current blocking layer and on the first second conductivity type cladding layer and growing a second conductivity type contacting layer on the second second conductivity type cladding layer; and forming first and second electrodes on the semiconductor substrate and the contacting layer, respectively.

According to an eighth aspect of the invention, a method of making a semiconductor laser includes successively growing on a first conductivity type semiconductor substrate a first conductivity type cladding layer, an active layer for producing light having a wavelength λ, a first second conductivity type cladding layer, and a first conductivity type current blocking layer; etching and removing a portion of the first conductivity type current blocking layer form a groove exposing part of the second conductivity type cladding layer; growing a second second conductivity type cladding layer on the current blocking layer and on the first second conductivity type cladding layer and growing a second conductivity type contacting layer on the second second conductivity type cladding layer, the contacting layer containing an element absorbing light having the wavelength λ; and forming first and second electrodes on the semiconductor substrate and the contacting layer, respectively.

BRIEF DESCRIPTION OF THE DRAWINGS

In all figures, like elements are given the same reference numbers.

DESCRIPTION OF PREFERRED EMBODIMENTS

Figure 1:
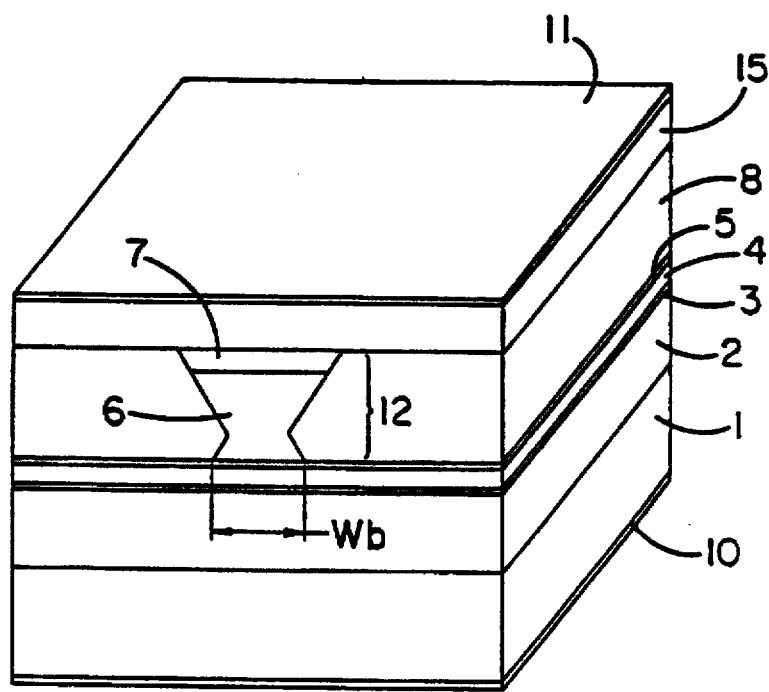
FIG. 1 is a perspective view of a semiconductor laser according to an embodiment of the invention.
Figure 5:
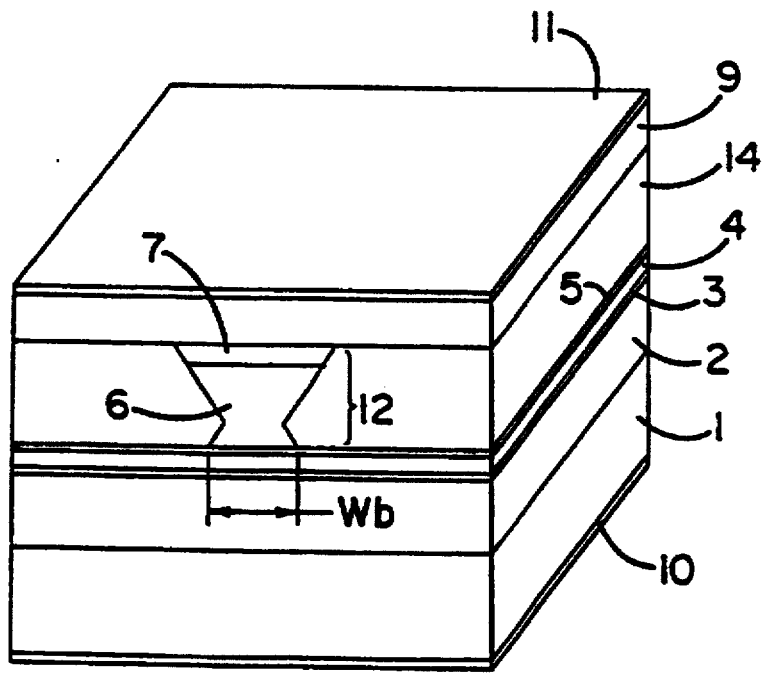
FIG. 5 is a perspective view of a semiconductor laser according to the prior art.
Figure 6A:
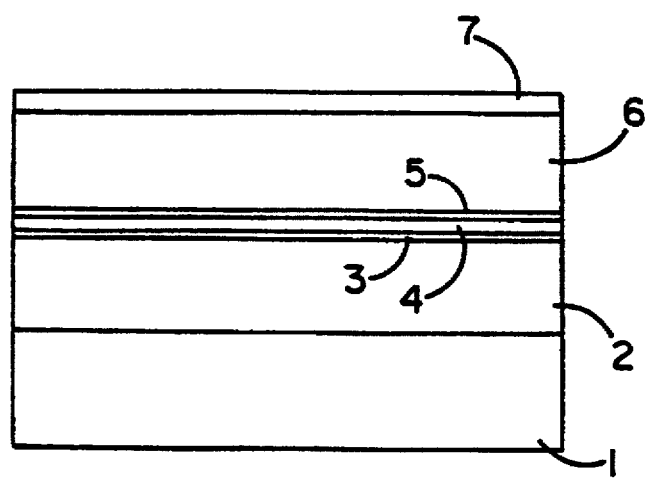
FIGS. 6(a)–6(e) are cross-sectional views illustrating a method of making the prior art semiconductor laser.
Figure 6B:
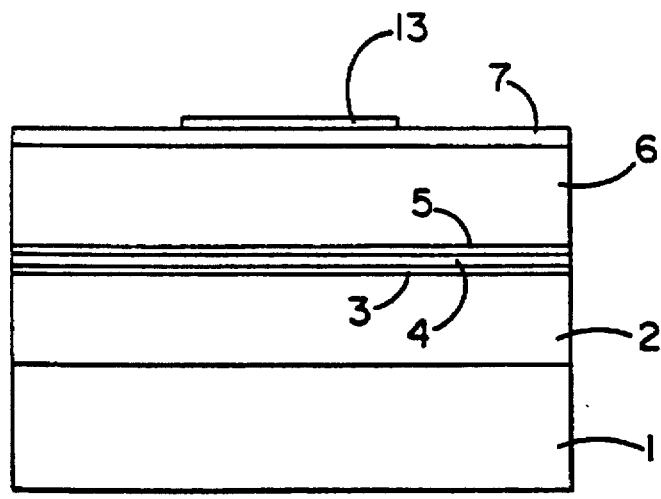
Figure 6C:
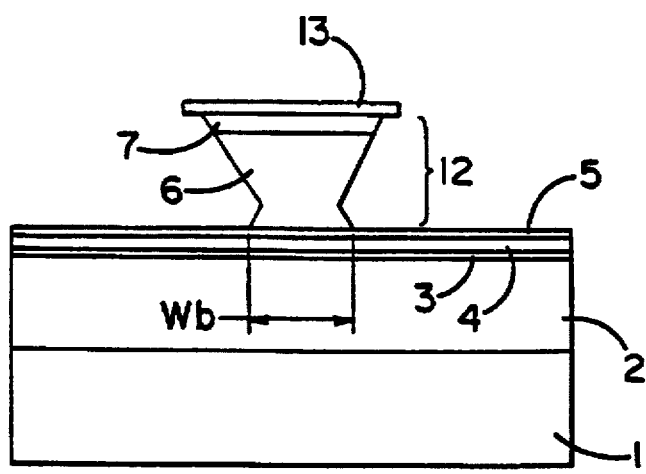
Figure 6D:
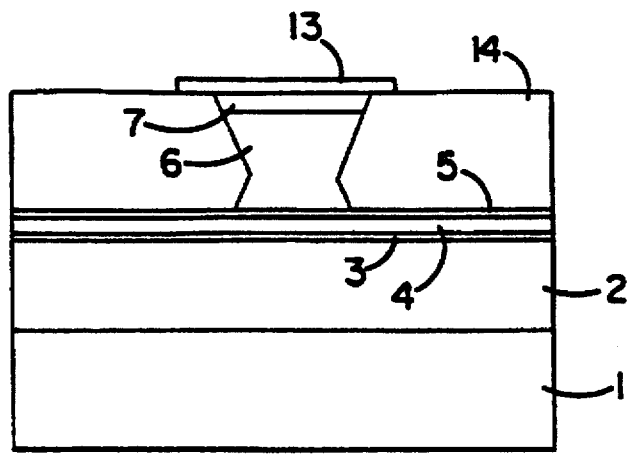
Figure 6E:
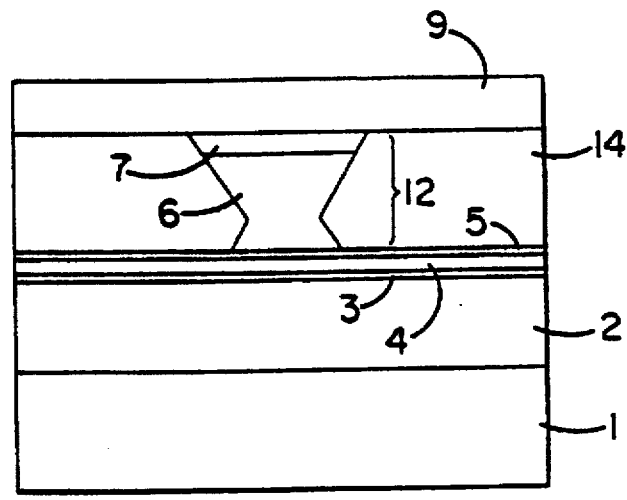
Figure 7A:
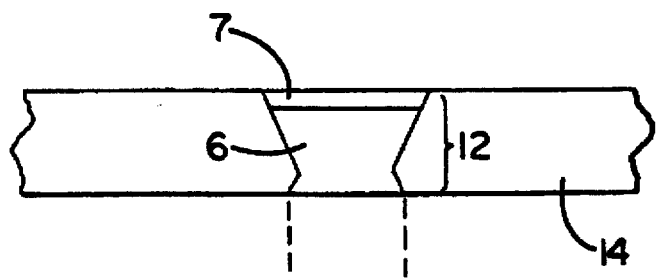
FIGS. 7(a) and 7(b) are an end view of a portion of a semiconductor laser according to the prior art and a graph of the refractive index of that portion of the prior art semiconductor laser as function of position.
Figure 7B:
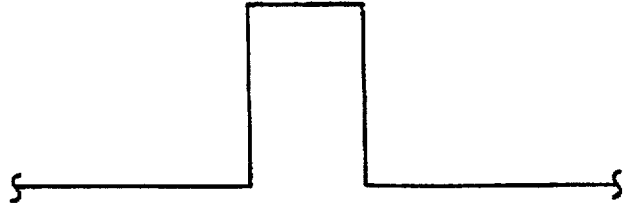

FIG. 1 is perspective view of a semiconductor laser according to the invention producing light with a wavelength of 0.98 micron. The semiconductor laser structure of FIG. 1 is identical to the semiconductor laser structure of FIG. 5 with the exception of the current blocking layer and the second contacting layer. Since it is unnecessary to repeat the description of the elements already described, the following description is particularly directed to the current blocking layer 8 and the second contacting layer 15 of the semiconductor laser embodiment of FIG. 1. The current blocking layer 8 of that semiconductor laser embodiment is n-type $Al_{0.7}Ga_{0.3}As$ containing erbium, preferably in a concentration of about $3 \times 10^{18}$ cm$^{-3}$. In addition, the second contacting layer 15 is p-type GaAs containing erbium.

A method of making the semiconductor laser of FIG. 1 is illustrated in FIGS. 2(a)–2(e). The steps illustrated in those figures are the same as those already described with respect to FIGS. 6(a)–6(e) with the exception of the growth of the current blocking layer 8 illustrated in FIG. 2(d) and the growth of the second contacting layer 15 illustrated in FIG. 2(e). After etching of the second p-type cladding layer 6 and the first contacting layer 7, for example, with a mixture or tartaric acid and hydrogen peroxide to produce the ridge waveguide 12 of FIG. 2(c), the n-type current blocking layer 8 of $Al_{0.7}Ga_{0.3}As$ containing erbium is epitaxially grown, preferably by MOCVD. In addition to using a conventional GaAs MOCVD process using triethyl gallium and arsine as sources of gallium and arsenic, isopropyl tris methylcyclopentadienyl erbium may be added as a source of erbium. After removal of the etching mask 13, the second contacting layer 15 of p-type GaAs containing erbium is epitaxially grown, preferably by MOCVD. In order to ensure that the current blocking layer 8 is n-type, during its growth a source of a dopant impurity, such as silicon or selenium, that produces n-type conductivity in AlGaAs is supplied. For example, silane may be used as a source of silicon during the MOCVD growth process. Likewise, to ensure that the second contacting layer 15 is p-type, a source of a dopant impurity, such as zinc, that produces p-type conductivity in GaAs is supplied during the growth of that layer.

Figure 3:
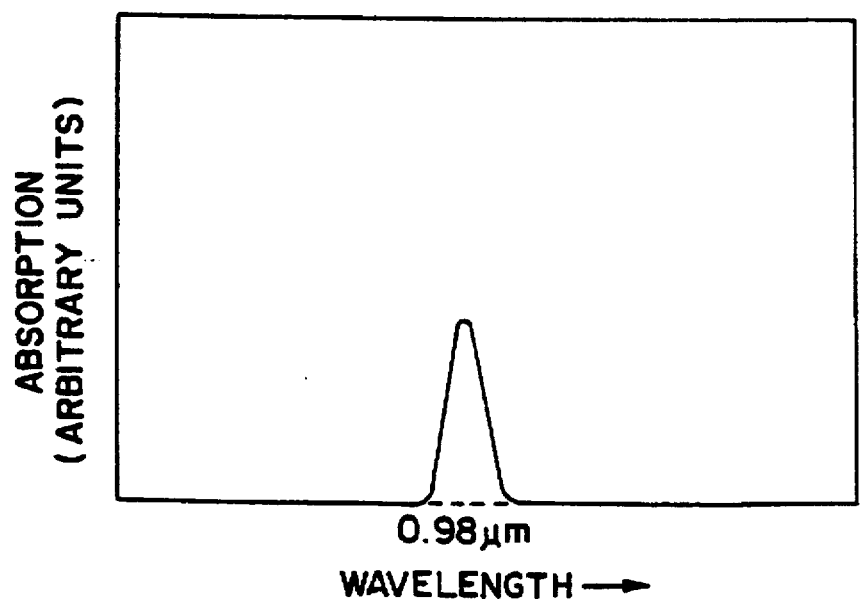
FIG. 3 is a graph showing light absorption as a function of wavelength by an erbium ion.
Figure 2A:
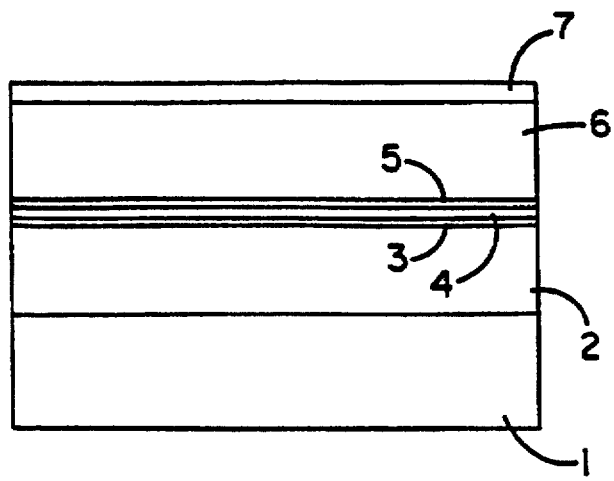
FIGS. 2(a)–2(e) are cross-sectional views illustrating a method of making a semiconductor laser according to an embodiment of the present invention.
Figure 2B:
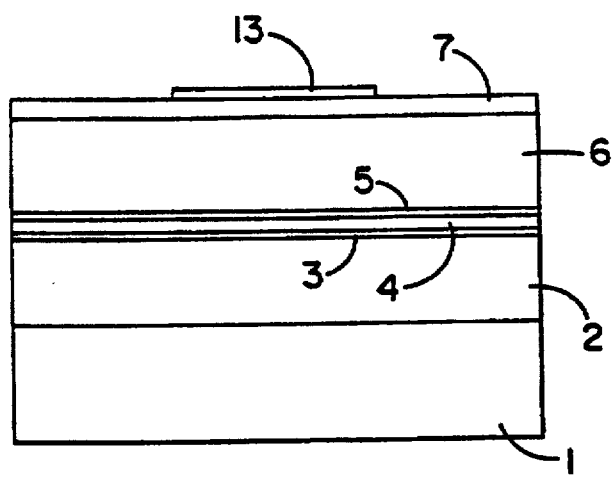
Figure 2C:
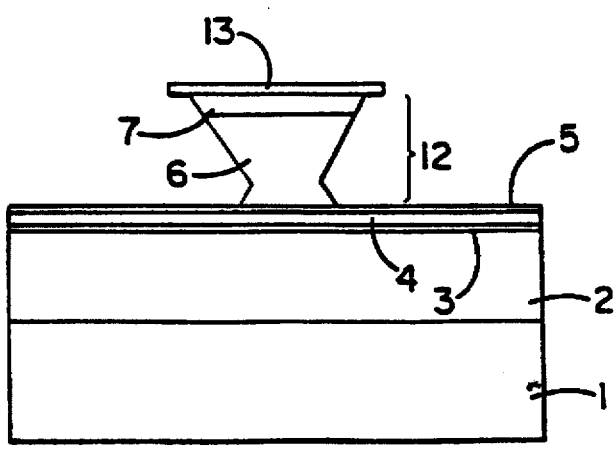
Figure 2D:
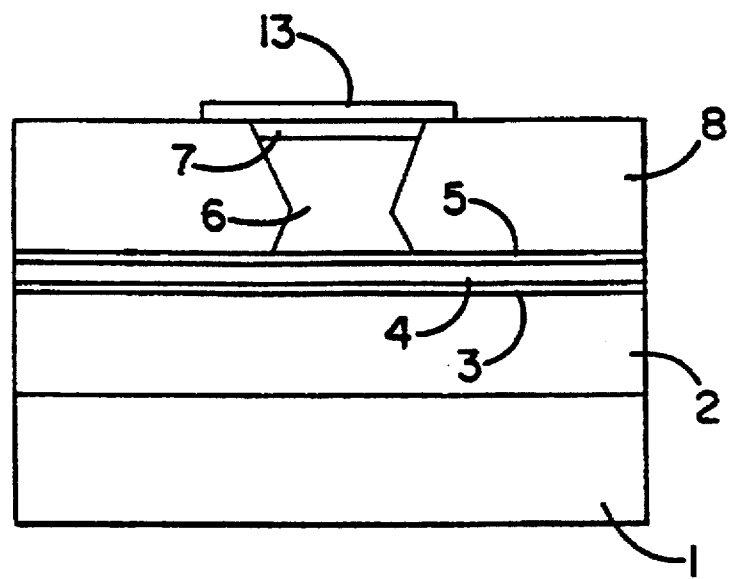
Figure 2E:
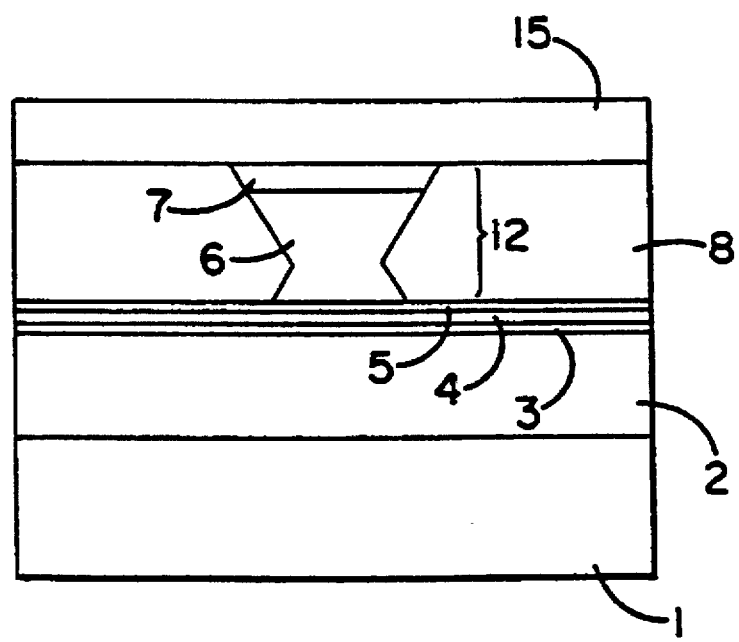

The operation of the semiconductor laser of FIG. 1 is fundamentally the same as that of the prior art semiconductor laser with the exception of the interaction between the light produced and the current blocking layer 8 and the second contacting layer 15 containing erbium in an ionized state. As illustrated in FIG. 3, erbium ions strongly and selectively absorb light having a wavelength of 0.98 micron. Therefore, when the semiconductor laser of FIG. 1 is oscillating and producing light of that wavelength, any light that leaks into the current blocking layer 8 is strongly absorbed by the erbium ions. Thus, since the current blocking layer 8 operates as a light absorption layer, the semiconductor laser according to this invention is not a real index type semiconductor laser like the prior art semiconductor laser of FIG. 5 but is a loss guide type semiconductor laser. A loss guide type semiconductor laser has a somewhat larger light loss in its waveguide, i.e., the ridge waveguide 12, than a real index type semiconductor laser because some of the light produced in and leaking from the ridge waveguide is absorbed in the current blocking layer rather than being reflected into the waveguide. As a result, the threshold current for producing laser oscillation in the loss guide laser is somewhat increased over the threshold current for the real index laser. However, since the laser light is strongly absorbed at the boundaries of the ridge waveguide 12, the gain for higher modes of oscillation that produce light intensity peaks at the edges of the waveguide is reduced, suppressing oscillation in those higher order modes. Because of the light absorption by the current blocking layer 14, the width Wb of the waveguide can be increased beyond the limit of the prior art laser from two to about five microns without undue risk of higher mode oscillation. The increased width Wb of the waveguide reduces the current density so that the dislocation density within the quantum well structure of the active layer 3 is not increased. In addition, the light density is decreased so that COD is prevented and highly reliable operation is achieved. Further, variations in the transverse mode divergence angle of the laser beam from semiconductor laser to semiconductor laser is decreased and that improved uniformity in laser characteristics improves the yield of the manufacturing process.

The second contacting layer 15 containing erbium is effective in reducing noise due to light reflected from the electrode 10. Light produced by the semiconductor laser and having a wavelength of 0.98 micron and propagating to the second contacting layer 15 is strongly absorbed by the erbium ions within that layer. Therefore, the amount of light reflected from the electrode 11 that returns to the ridge waveguide 12 is significantly reduced. The reduction in reflected light reduces or eliminates disturbances in the first order longitudinal mode of oscillation of the semiconductor laser and reduces or eliminates noise in the laser beam produced.

Both the current blocking layer 8 and the second contacting layer 15 of the semiconductor laser of FIG. 1 include erbium and strongly absorb the light produced by the semiconductor laser. However, only one of the current blocking and second contacting layers needs to contain erbium or a similar highly selective light absorbing element to achieve the advantages of the invention. Thus, the invention encompasses semiconductor lasers in which only one of the layers contains ions that strongly absorb light of the wavelength produced by the semiconductor laser.

Both the prior art semiconductor laser and the semiconductor laser according to the invention illustrated in FIG. 1 include an etching stopping layer that divides the p-type cladding layer into first and second p-type cladding layers 4 and 6. However, the etching stopping layer 5 is not essential to the invention although it is useful in simplifying the manufacturing process. Without the etching stopping layer 5, the etching process to produce the ridge waveguide 12 must be controlled to ensure that the p-type cladding layer is not completely removed from the active layer 3 at any location within the laser. Without the etching stopping layer 5, the laser includes only a single cladding layer having a conductivity type opposite the conductivity type of the cladding layer 2.

Figure 4:
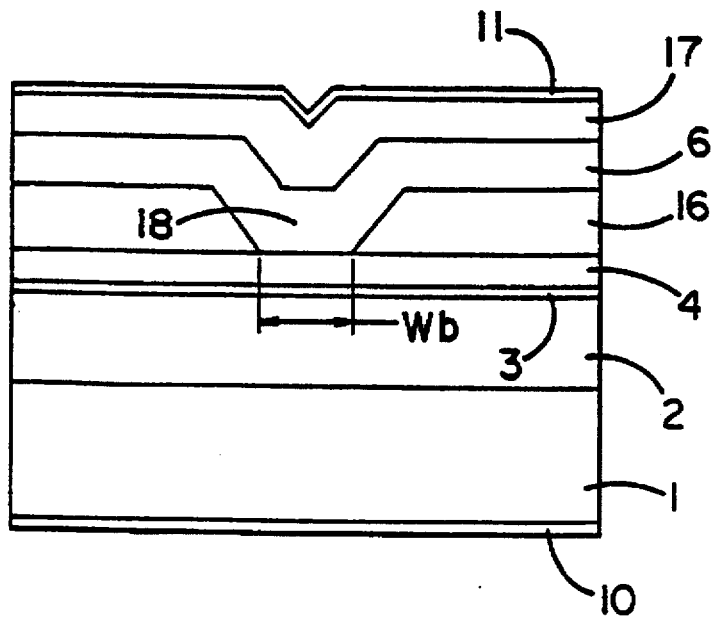
FIG. 4 is a perspective view of a semiconductor laser according to another embodiment of the present invention.

FIG. 4 is an end view of a self-alignment structure (SAS) semiconductor laser according to another embodiment of the invention. The substrate 1, cladding layer 2, active layer 3, and electrodes 10 and 11 of the SAS semiconductor laser of FIG. 4 are identical to those of the semiconductor laser of FIG. 1 and do not need repeated description. In this groove-type semiconductor laser, a current blocking layer 16 is disposed on part of the first p-type cladding layer 4. A portion of that first p-type cladding layer 4 is exposed by discontinuous parts of the current blocking layer 16 and has a waveguide width Wb where exposed by the current blocking layer 16. The second p-type cladding layer 6 is disposed on the current blocking layer 16 and contacts the first p-type cladding layer 4 in the opening of width Wb. A contacting layer 17 is disposed on the second p-type cladding layer 6. The SAS semiconductor laser is produced, after sequentially depositing the layers 2, 3, 4, and 16, by etching and removing part of the current blocking layer 16 to form the groove, exposing part of the first p-type cladding layer 4. Thereafter, the second p-type cladding layer 6 and the contacting layer 17 are epitaxially grown.

At least one of the current blocking layer 16 and the contacting layer 17 in the semiconductor laser of FIG. 4 contains erbium. As in the previously described process, a dopant impurity source is supplied during the growth of each of those layers to ensure that the layers have the desired conductivity types. Erbium is incorporated into at least one of the grown layers 16 and 17 for absorbing the 0.98 micron wavelength light produced by the semiconductor laser.

The operation of this semiconductor laser and the effects of the erbium-containing layers are the same as those described for the other semiconductor laser embodiment and do not need repeated description. The light absorption by the erbium-containing layers improves the stability of first order transverse mode oscillation, suppresses higher order mode oscillation, permits the width of the groove to be broadened, increasing current density without undue risk of higher order mode oscillation, eliminates or reduces noise from light reflected from the electrode 11, and improves production yield.

In each of the specific embodiments of the invention described, certain layers were described as containing erbium in order to absorb light having a wavelength of 0.98 micron. Instead of erbium, holmium can be used for absorbing light of 0.98 micron wavelength or neodymium can be used for absorbing light in a semiconductor laser producing light at a wavelength of 0.87 micron.

The invention has been described with respect to certain embodiments. Various modifications and additions within the spirit of the invention will occur to those of skill in the art. Accordingly, the scope of the invention is limited solely by the following claims.

I claim:

1. A semiconductor laser comprising:

a first conductivity type semiconductor substrate;

a first conductivity type cladding layer disposed on the semiconductor substrate;

an active layer disposed on the first conductivity type cladding layer for producing light having a wavelength $\lambda$;

a light waveguide structure comprising a second conductivity type cladding layer disposed on part of the active layer;

a first conductivity type current blocking layer disposed on parts of the active layer, on opposite sides of, contacting, and confining the light waveguide structure and containing an element absorbing light having the wavelength $\lambda$;

a second conductivity type contacting layer contacting the light waveguide structure and the current blocking layer; and first and second electrodes respectively disposed on the substrate and the contacting layer.

2. The semiconductor laser of claim 1 wherein the contacting layer also contains the element absorbing light having the wavelength $\lambda$.

3. The semiconductor laser of claim 1 wherein the active layer is a quantum well structure including InGaAs.

4. The semiconductor laser of claim 1 wherein the element absorbing light having a wavelength $\lambda$ is selected from the group consisting of erbium, holmium, and neodymium.

5. The semiconductor laser of claim 1 wherein the light waveguide structure includes a first contacting layer having the second conductivity type and disposed between and contacting the second conductivity type cladding layer and the contacting layer.

6. The semiconductor laser of claim 1 including an etching stopping layer disposed within the second conductivity type cladding layer and contacting the current blocking layer.

7. A semiconductor laser comprising:

a first conductivity type semiconductor substrate;

a first conductivity type cladding layer disposed on the semiconductor substrate;

an active layer disposed on the first conductivity type cladding layer for producing light having a wavelength $\lambda$;

a light waveguide structure comprising a second conductivity type cladding layer disposed on part of the active layer;

a first conductivity type current blocking layer disposed on parts of the active layer, at opposite sides of, contacting, and confining the light waveguide structure;

a second conductivity type contacting layer contacting the light waveguide structure and the current blocking layer and containing an element absorbing light having the wavelength $\lambda$; and first and second electrodes respectively disposed on the substrate and the contacting layer.

8. The semiconductor laser of claim 7 wherein the active layer is a quantum well structure including InGaAs.

9. The semiconductor laser of claim 7 wherein the element absorbing light having a wavelength $\lambda$ is selected from the group consisting of erbium, holmium, and neodymium.

10. The semiconductor laser of claim 7 wherein the light waveguide structure includes a first contacting layer having the second conductivity type and disposed between and contacting the second conductivity type cladding layer and the contacting layer.

11. The semiconductor laser of claim 7 including an etch stopping layer disposed within the second conductivity type cladding layer and contacting the current blocking layer.

12. A semiconductor laser comprising:

a first conductivity type semiconductor substrate;

a first conductivity type cladding layer disposed on the semiconductor substrate;

an active layer disposed on the first conductivity type cladding layer for producing light having a wavelength $\lambda$;

a light waveguide structure comprising a first second conductivity type cladding layer disposed on the active layer, a first conductivity type current blocking layer disposed on and contacting the first second conductivity type cladding layer, containing an element absorbing light having the wavelength $\lambda$, and including a groove exposing part of the first second conductivity type cladding layer, and a second second conductivity type cladding layer disposed on the current blocking layer and on the first second conductivity type cladding layer in the groove;

a second conductivity type contacting layer disposed on the second second conductivity type cladding layer; and first and second electrodes respectively disposed on the substrate and the contacting layer.

13. The semiconductor laser of claim 12 wherein the contacting layer also contains the element absorbing light having the wavelength $\lambda$.

14. A semiconductor laser comprising:

a first conductivity type semiconductor substrate;

a first conductivity type cladding layer disposed on the semiconductor substrate;

an active layer disposed on the first conductivity type cladding layer for producing light having a wavelength $\lambda$;

a light waveguide structure comprising a first second conductivity type cladding layer disposed on the active layer, a first conductivity type current blocking layer disposed on and contacting the first second conductivity type cladding layer and including a groove exposing part of the first second conductivity type cladding layer, and a second second conductivity type cladding layer disposed on the current blocking layer and on the first second conductivity type cladding layer in the groove;

a second conductivity type contacting layer disposed on the second second conductivity type cladding layer and containing an element absorbing light having the wavelength $\lambda$; and first and second electrodes respectively disposed on the substrate and the contacting layer.

* * * * *